United States Patent
Huang et al.

(10) Patent No.: US 9,490,163 B2
(45) Date of Patent: Nov. 8, 2016

(54) TAPERED SIDEWALL CONDUCTIVE LINES AND FORMATION THEREOF

(71) Applicant: Taiwan Semiconductor Manufacturing Company Limited, Hsin-Chu (TW)

(72) Inventors: Chien-Hua Huang, Toufen Township (TW); Hsin-Chieh Yao, Hsinchu (TW); Chung-Ju Lee, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/265,437

(22) Filed: Apr. 30, 2014

(65) Prior Publication Data

US 2014/0232000 A1 Aug. 21, 2014

Related U.S. Application Data

(63) Continuation-in-part of application No. 13/600,504, filed on Aug. 31, 2012, now abandoned.

(51) Int. Cl.
*H01L 21/768* (2006.01)
*H01L 23/522* (2006.01)
*H01L 23/532* (2006.01)

(52) U.S. Cl.
CPC ..... *H01L 21/7682* (2013.01); *H01L 21/76885* (2013.01); *H01L 23/5222* (2013.01); *H01L 23/53295* (2013.01); *H01L 21/76804* (2013.01); *H01L 2924/0002* (2013.01)

(58) Field of Classification Search
CPC ........... H01L 21/76879; H01L 21/768; H01L 23/53228; H01L 23/53257; H01L 23/5226; H01L 2924/0002
See application file for complete search history.

(56) References Cited

U.S. PATENT DOCUMENTS

| | | | | |
|---|---|---|---|---|
| 5,641,712 A * | 6/1997 | Grivna | ............... | H01L 21/7682 204/192.37 |
| 5,759,913 A * | 6/1998 | Fulford, Jr. | ......... | H01L 21/7682 257/E21.576 |
| 6,140,226 A * | 10/2000 | Grill | ................ | H01L 21/76811 257/E21.579 |
| 6,165,897 A * | 12/2000 | Jang | ................... | H01L 21/02164 257/E21.279 |
| 6,251,799 B1 * | 6/2001 | Lai | ...................... | H01L 21/7682 257/E21.581 |
| 6,303,464 B1 * | 10/2001 | Gaw | ................... | H01L 21/7682 257/758 |
| 6,399,476 B2 * | 6/2002 | Kim | .................... | H01L 21/7682 257/E21.581 |
| 6,445,072 B1 * | 9/2002 | Subramanian | ...... | H01L 21/7682 257/637 |
| 7,553,756 B2 * | 6/2009 | Hayashi | ............ | H01L 21/76802 257/522 |
| 7,928,003 B2 * | 4/2011 | Naik | ................. | H01L 21/31144 438/624 |
| 8,293,617 B2 * | 10/2012 | McGinnis | ......... | H01L 21/02164 257/E21.463 |
| 2006/0043591 A1 * | 3/2006 | Yim | ....................... | C23C 16/401 257/758 |
| 2009/0093100 A1 * | 4/2009 | Xia et al. | ....................... | 438/421 |
| 2010/0093168 A1 * | 4/2010 | Naik | ................. | H01L 21/31144 438/618 |
| 2012/0187566 A1 * | 7/2012 | Horak | ................. | H01L 21/7682 257/774 |
| 2012/0319279 A1 * | 12/2012 | Isobayashi | ......... | H01L 23/4821 257/751 |

* cited by examiner

*Primary Examiner* — John P Dulka
(74) *Attorney, Agent, or Firm* — Cooper Legal Group, LLC (57) ABSTRACT

A semiconductor arrangement and methods of formation are provided. The semiconductor arrangement includes conductive lines having sidewalls angled between about 45° to about 90° relative to a plane in which bottom surfaces of the conductive lines lie. A dielectric layer is formed over the conductive lines. The angled sidewalls of the conductive lines cause the dielectric layer to pinch off before an area between adjacent conductive lines is filled, thus establishing an air gap between adjacent conductive lines, where the air gap has a lower dielectric constant than the dielectric material.

20 Claims, 3 Drawing Sheets

TAPERED SIDEWALL CONDUCTIVE LINES AND FORMATION THEREOF

BACKGROUND

Contacts are used to make electrical connections in or among different features in a semiconductor arrangement. A contact, for example, is used to connect one metal layer to another metal layer, where the metal layers are otherwise electrically isolated from one another, such as by an insulating or dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. Some embodiments of the present disclosure have one or a combination of the following features and/or advantages.

In some embodiments, the semiconductor arrangement comprises a first conductive line having sidewalls that are at a first angle between about 45° to about 90° relative to a first plane in which a bottom surface of the first conductive line lies. In some embodiments, a first dielectric layer surrounds the first conductive line. In some embodiments, the first dielectric layer defines a first air gap adjacent the first conductive line. For example, the first air gap exists within or is surrounded by the first dielectric layer, where at least one of the angled sidewalls facilitates formation of the first air gap within the first dielectric layer, according to some embodiments. In some embodiments, the first air gap is disposed between the first conductive line and a second conductive line and has a dielectric constant of about 1, which is less than a dielectric constant of the first dielectric layer. In some embodiments, the relatively lower dielectric constant of the air gap yields a reduced parasitic capacitance, where such a paratactic capacitance develops between the first conductive line and the second conductive line, as compared to a semiconductor arrangement that does not have such an air gap between a first conductive line and a second conductive line. In some embodiments, a reduced parasitic capacitance promotes desired performance of the semiconductor arrangement, such as increased operating speed(s).

In some embodiments, the first dielectric layer is formed after the first conductive line is formed. In some embodiments, forming the first dielectric layer after the first conductive line is formed inhibits damage to the first dielectric layer, such as by not subjecting the first dielectric layer to an etching process. For example, when a dielectric layer is formed before a conductive line is formed, the dielectric layer is etched to form a trench in the dielectric layer and the conductive line is formed in the trench. However, etching the dielectric layer to form the trench damages the dielectric layer, such that the lattice structure of the dielectric layer such that the lattice structure of the dielectric layer is less uniform as compared to the lattice structure of the dielectric layer prior to such etching. Given that the first dielectric layer is formed after the first conductive line is formed, and therefore is not etched, the first dielectric layer has a substantially uniform lattice structure which serves to maintain the dielectric constant of the first dielectric layer. The maintained or non-increased dielectric constant likewise serves to reduce the parasitic capacitance as compared to a semiconductor arrangement that has a corresponding dielectric layer that has been subjected to an etching process, and thus has a less uniform lattice structure.

Figure 1:
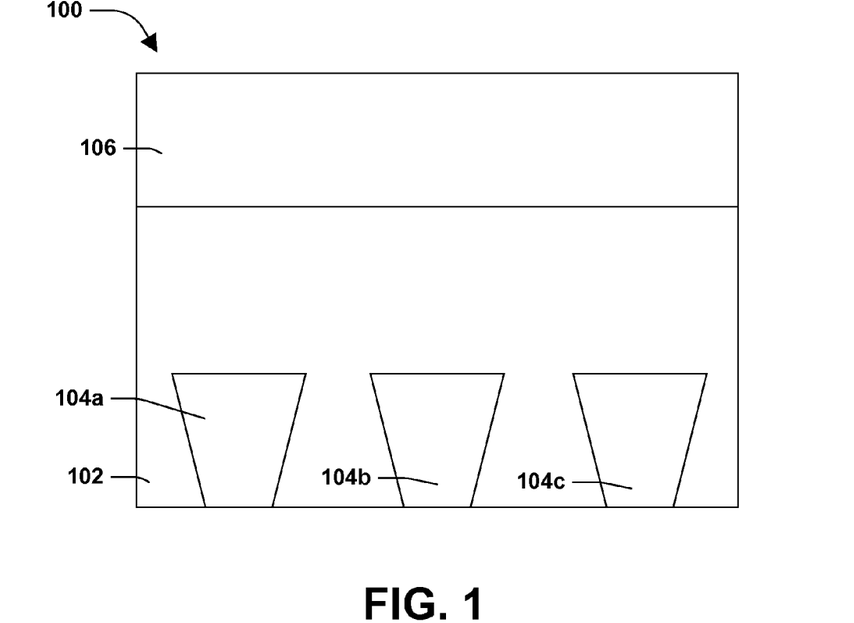
FIG. 1 is a cross-section diagram illustrating formation of a skeleton layer for a semiconductor arrangement, in accordance with some embodiments.

FIGS. 1-6 are cross-sectional views of a semiconductor arrangement 100, according to some embodiments, at various stages of fabrication. Turning to FIG. 1, a skeleton layer 106 is formed over a dielectric layer, where the dielectric layer is regarded as a second dielectric layer 102, according to some embodiments, and where a subsequently formed dielectric layer is regarded as a first dielectric layer 122, according to some embodiments. The subsequently formed first dielectric layer 122 is explained later with reference to FIG. 6. In some embodiments, the skeleton layer 106 comprises as at least one of silicon, oxide, nitride, carbon, titanium, aluminum, tantalum, titanium nitride, titanium oxide, aluminum oxide, tantalum nitride, silicon oxide, silicon nitride, silicon, amorphous-carbon, etc. In some embodiments, the skeleton layer 106 is at least one of grown or deposited. In some embodiments, a layer is grown by forming a film from gaseous or liquid precursors on a surface, such as a surface of the second dielectric layer 102. In some embodiments, the skeleton layer 106 is a hard mask. In some embodiments, the skeleton layer 106 has non-uniform dimensions, such as a non-uniform thickness. In some embodiments, the non-uniform thickness is a thickness that increases or decreases, uniformly or non-uniformly, from left to right on the page or vice versa. Other materials for the skeleton layer 106, other techniques for forming the skeleton layer 106 and/or other dimensions of the skeleton layer 106 are within the scope of various embodiments.

In some embodiments, the second dielectric layer 102 comprises a low dielectric constant material. In some embodiments, a low dielectric constant material has a dielectric constant of less than about 3. In some embodiments, the second dielectric layer 102 comprises at least one of oxide or nitride. As illustrated, the second dielectric layer 102 surrounds at least one of a first conductive contact 104a, a second conductive contact 104b or a third conductive contact 104c. For simplicity, the second dielectric layer 102 is said to comprise at least one of the first conductive contact 104a, the second conductive contact 104b or the third conductive contact 104c. In some embodiments, at least one of the first conductive contact 104a, the second conductive contact 104b or the third conductive contact 104c is connected to one or more features (not shown), such as at least one of a power source, a device, a source, a drain, etc. In some embodiments, at least one of the first conductive contact 104a, the second conductive contact 104b or the third conductive contact 104c comprises a conductive material, such as metal. In some embodiments, the second dielectric layer 102 is over a substrate (not shown). In some embodiments, the substrate includes at least one of an epitaxial layer, a silicon-on-insulator (SOI) structure, a wafer, or a die formed from a wafer. Other materials for the substrate are within the scope of various embodiments.

Figure 2:
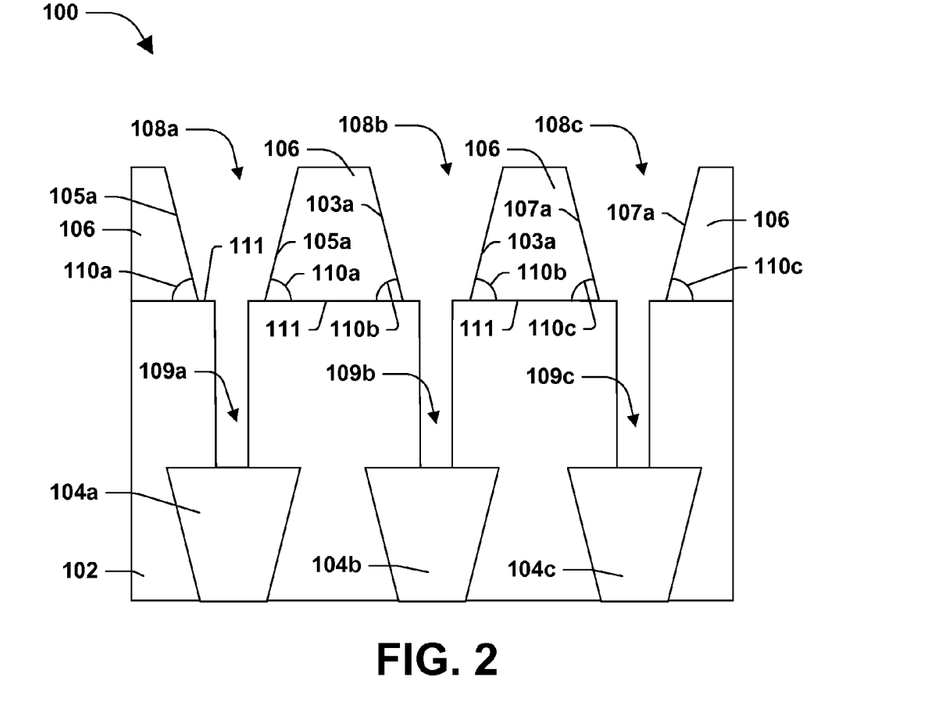
FIG. 2 is a cross-section diagram illustrating formation of one or more trenches for a semiconductor arrangement, in accordance with some embodiments.

Turning to FIG. 2, at least one of a first trench 108a is formed in the skeleton layer 106 over the first conductive contact 104a, a second trench 108b is formed in the skeleton layer 106 over the second conductive contact 104b or a third trench 108c is formed in the skeleton layer 106 over the third conductive contact 104c, according to some embodiments. In some embodiments, the first trench 108a is defined by sidewalls 105a in the skeleton layer 106, where the sidewalls 105a are at a first angle 110a between about 45° to about 90° relative to a top surface 111 of the second dielectric layer 102. In some embodiments, a first via opening 109a is formed in the second dielectric layer 102 under the first trench 108a and over the first conductive contact 104a, such that a portion of the first conductive contact 104a is exposed by the first via opening 109a.

In some embodiments, the second trench 108b is defined by sidewalls 103a in the skeleton layer 106, where the sidewalls 103a are at a second angle 110b between about 45° to about 90° relative to the top surface 111 of the second dielectric layer 102. In some embodiments, a second via opening 109b is formed in the second dielectric layer 102 under the second trench 108b and over the second conductive contact 104b, such that a portion of the second conductive contact 104b is exposed by the second via opening 109b. In some embodiments, the third trench 108c is defined by sidewalls 107a in the skeleton layer 106, where the sidewalls 107a are at a third angle 110c between about 45° to about 90° relative to the top surface 111 of the second dielectric layer 102. In some embodiments, a third via opening 109c is formed in the second dielectric layer 102 under the third trench 108c and over the third conductive contact 104c, such that a portion of the third conductive contact 104c is exposed by the third via opening 109c.

In some embodiments, at least one of the first trench 108a and the first via opening 109a, the second trench 108b and the second via opening 109b or the third trench 108c and the third via opening 109c are formed by a double patterning process comprising etching. In some embodiments, at least one of the first trench 108a, the second trench 108b or the third trench 108c is formed by anisotropic etching. In some embodiments, the angled or tapered profiles of at least one of the sidewalls 105a, the sidewalls 103a or the sidewalls 107a facilitate the formation of at least one of the first via opening 109a, the second via opening 109b or the third via opening 109c by providing overlay control for critical dimensions.

According to some embodiments, an angular value varies among at least one of the first angle 110a, the second angle 110b or the third angle 110c. According to some embodiments, a first angular value for the first angle 110a differs from at least one of a second angular value for the second angle 110b or a third angular value for the third angle 110c. According to some embodiments, a second angular value for the second angle 110b differs from at least one of a first angular value for the first angle 110a or a third angular value for the third angle 110c. According to some embodiments, a third angular value for the third angle 110c differs from at least one of a second angular value for the second angle 110b or a first angular value for the first angle 110a.

Figure 3:
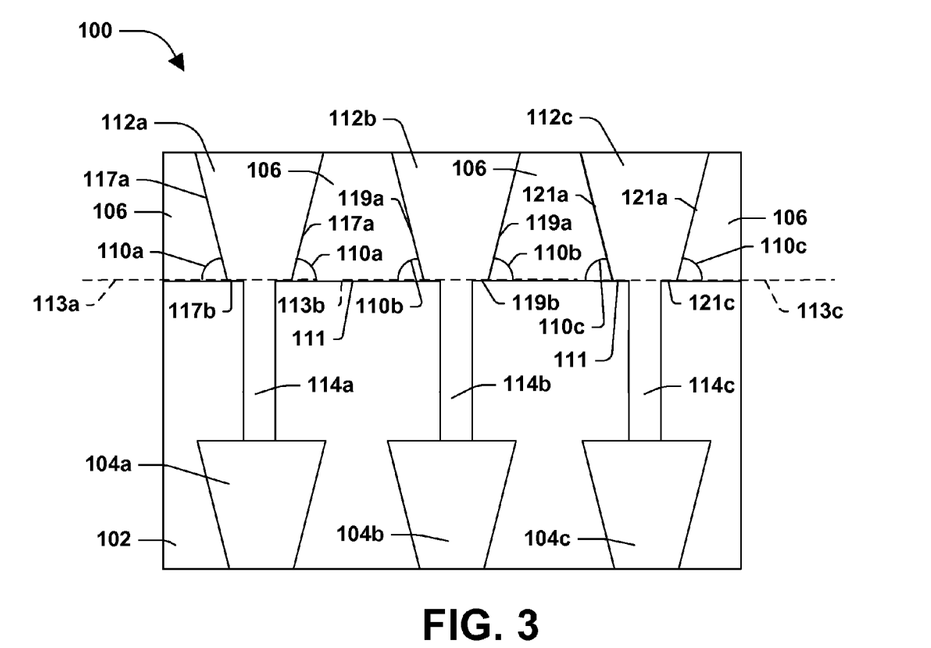
FIG. 3 is a cross-section diagram illustrating formation of one or more conductive lines for a semiconductor arrangement, in accordance with some embodiments.

Turning to FIG. 3, a first material is formed in the first trench 108a to form a first conductive line 112a. In some embodiments, prior to forming the first conductive line 112a, a via material is used to form a first via 114a in the first via opening 109a, where the via material is the same or different from the first material. In some embodiments, the first material is formed in the second trench 108b to form a second conductive line 112b. In some embodiments, prior to forming the second conductive line 112b, the via material is used to form a second via 114b in the second via opening 109b. In some embodiments, the first material is formed in the third trench 108c to form a third conductive line 112c. In some embodiments, prior to forming the third conductive line 112c, the via material is used to form a third via 114c in the third via opening 109c.

In some embodiments, the first material differs among at least one of the first conductive line 112a, the second conductive line 112b or the third conductive line 112c. In some embodiments, at least one of the first conductive line 112a, the second conductive line 112b or the third conductive line 112c comprises at least one of copper, cobalt, tungsten, aluminum, titanium, tantalum, etc. In some embodiments, at least one of the first conductive line 112a, the second conductive line 112b or the third conductive line 112c is formed by deposition, such as by at least one of atomic layer deposition (ALD), chemical vapor deposition (CVD) or physical vapor deposition (PVD). In some embodiments, the via material differs among at least one of the first via 114a, the second via 114b or the third via 114c. In some embodiments, at least one of the first via 114a, the second via 114b or the third via 114c comprises at least one of copper, cobalt, tungsten, aluminum, titanium, tantalum, etc. In some embodiments, at least one of the first via 114a, the second via 114b or the third via 114c is formed by deposition such as by at least one of ALD, CVD or PVD.

In some embodiments, given that the first conductive line 112a is formed in the first trench 108a, the first conductive line 112a has sidewalls 117a at the first angle 110a between about 45° to about 90° relative to a first plane 113a in which a bottom surface 117b of the first conductive line 112a lies. According to some embodiments, the first plane 113a corresponds to or is coplanar with the top surface 111 of the second dielectric layer 102. In some embodiments, given that the second conductive line 112b is formed in the second trench 108b, the second conductive line 112b has sidewalls 119a at the second angle 110b between about 45° to about 90° relative to a second plane 113b in which a bottom surface 119b of the second conductive line 112b lies. According to some embodiments, the second plane 113b corresponds to or is coplanar with the top surface 111 of the second dielectric layer 102. In some embodiments, given that the third conductive line 112c is formed in the third trench 108c, the third conductive line 112c has sidewalls 121a at the third angle 110c between about 45° to about 90° relative to a third plane 113c in which a bottom surface 121c of the third conductive line 112c lies. According to some embodiments, the third plane 113c corresponds to or is coplanar with the top surface 111 of the second dielectric layer 102.

According to some embodiments, an angular value varies among at least one of the first angle 110a for the first conductive line 112a, the second angle 110b for the second conductive line 112b or the third angle 110c for the third conductive line 112c. According to some embodiments, a first angular value for the first angle 110a differs from at least one of a second angular value for the second angle 110b or a third angular value for the third angle 110c. According to some embodiments, a second angular value for the second angle 110b differs from at least one of a first angular value for the first angle 110a or a third angular value for the third angle 110c. According to some embodiments, a third angular value for the third angle 110c differs from at least one of a second angular value for the second angle 110b or a first angular value for the first angle 110a.

According to some embodiments, a first barrier layer (not shown) is formed in the first trench 108a and the first via opening 109a prior to forming the first via 114a and the first conductive line 112a. According to some embodiments, a second barrier layer (not shown) is formed in the second trench 108b and the second via opening 109b prior to forming the second via 114b and the second conductive line 112b. According to some embodiments, a third barrier layer (not shown) is formed in the third trench 108c and the third via opening 109c prior to forming the third via 114c and the third conductive line 112c. In some embodiments, the first barrier layer is formed conformally to the first trench 108a and the first via opening 109a. In some embodiments, the second barrier layer is formed conformally to the second trench 108b and the second via opening 109b. In some embodiments, the third barrier layer is formed conformally to the third trench 108c and the third via opening 109c.

In some embodiments, at least one of the first barrier layer, the second barrier layer or the third barrier layer is formed by deposition, such as by at least one of ALD, CVD or PVD. In some embodiments, at least one of the first barrier layer, the second barrier layer or the third barrier layer comprises a dielectric material. In some embodiments, the first barrier layer has a thickness at least one of about $1/10^{th}$ a maximum width of the first via opening 109a or about $1/50^{th}$ a maximum width of the first trench 108a, where width is measured left to right on the page. In some embodiments, the second barrier layer has a thickness at least one of about $1/10^{th}$ a maximum width of the second via opening 109b or about $1/50^{th}$ a maximum width of the first trench 108b, where width is measured left to right on the page. In some embodiments, the third barrier layer has a thickness at least one of about $1/10^{th}$ a maximum width of the third via opening 109c or about $1/50^{th}$ a maximum width of the third trench 108c, where width is measured left to right on the page.

When the first barrier layer is formed, the via material is formed over the first barrier layer in the first via opening 109a to form the first via 114a, and the first material is formed over the first barrier layer in the first trench 108a to form the first conductive line 112a. When the second barrier layer is formed, the via material is formed over the second barrier layer in the second via opening 109b to form the second via 114b, and the first material is formed over the second barrier layer in the second trench 108b to form the second conductive line 112b. When the third barrier layer is formed, the via material is formed over the third barrier layer in the third via opening 109c to form the third via 114c, and the first material is formed over the third barrier layer in the third trench 108c to form the third conductive line 112c. According to some embodiments, the sidewalls 117a of the first conductive line 112a are at the first angle 110a regardless of whether the first barrier layer is formed. According to some embodiments, the sidewalls 119a of the second conductive line 112b are at the second angle 110b regardless of whether the second barrier layer is formed. According to some embodiments, the sidewalls 121a of the third conductive line 112c are at the third angle 110c regardless of whether the third barrier layer is formed.

Figure 4:
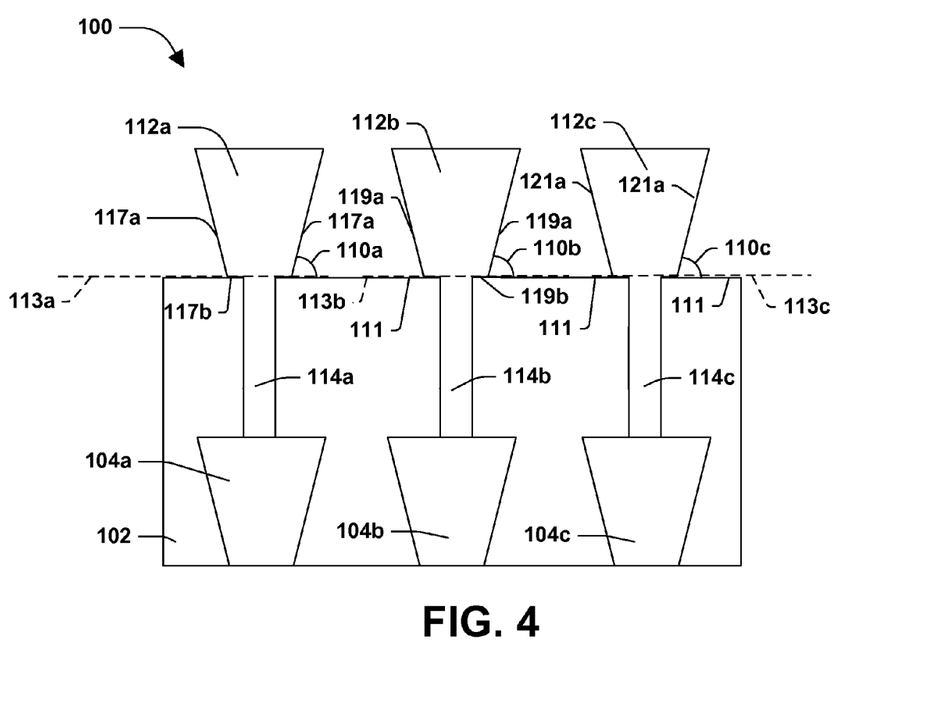
FIG. 4 is a cross-section diagram illustrating removal of the skeleton layer, in accordance with some embodiments.

Turning to FIG. 4, the skeleton layer 106 is removed, according to some embodiments. In some embodiments, the skeleton layer 106 is removed by at least one of a wet etch or a dry etch. In some embodiments, the wet etch comprises using an etchant comprising at least one of glycolether compound, modified oxirane polymer, organosulfur compound, methylimidazole, aminoethanol, aminopropanol, hydroxyamine, tetramethylammonium hydroxide, hydrogen peroxide, dilute hydrogen fluoride, hydrogen fluoride, etc. In some embodiments, the dry etch comprises using an etchant comprising at least one of carbon dioxide, oxygen, a nitrogen hydrogen strip, etc. By removing the skeleton layer 106, the sidewalls 117a of the first conductive line 112a, the sidewalls 119a of the second conductive line 112b, the sidewalls of the third conductive line 112c and at least some of the top surface 111 of the second dielectric layer 102 are exposed, according to some embodiments.

Figure 5:
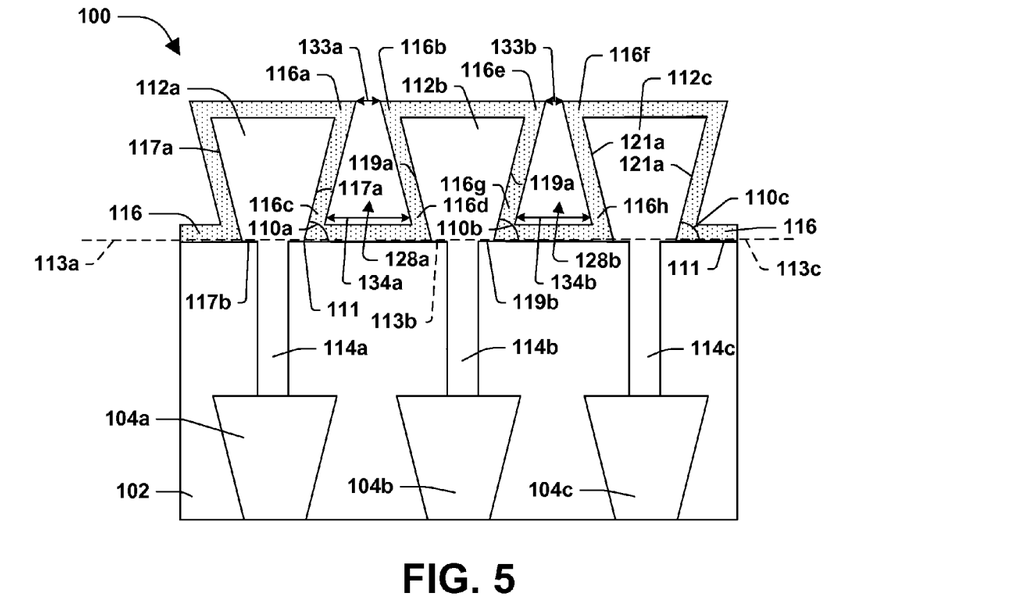
FIG. 5 is a cross-section diagram illustrating formation of a conformal dielectric layer for a semiconductor arrangement, in accordance with some embodiments.

Turning to FIG. 5, a conformal dielectric layer 116 is formed over at least one of the first conductive line 112a, the second conductive line 112b, the third conductive line 112c or exposed portions of the top surface 111 of the second dielectric layer 102, according to some embodiments. Although other features, layers, etc. are not illustrated as being filled in with a pattern, the conformal dielectric layer 116 is illustrated using a pattern so that the conformal dielectric layer 116 is more easily distinguishable from other features, layers, etc. According to some embodiments, the conformal dielectric layer 116 has a substantially uniform or consistent thickness over the first conductive line 112a, the second conductive line 112b, the third conductive line 112c and exposed portions of the top surface 111 of the second dielectric layer 102, and thus is regarded as conformal.

In some embodiments, the conformal dielectric layer 116 is formed by at least one of growth or deposition. Forming the conformal dielectric layer 116 by growth comprises forming a thin film using at least one of one or more gaseous precursors or one or more liquid precursors, according to some embodiments. Forming the conformal dielectric layer 116 by deposition comprises using at least one of ALD, CVD, or PVD, according to some embodiments. In some embodiments, the conformal dielectric layer 116 is formed at a temperature between about 0° C. to about 500° C. In some embodiments, the conformal dielectric layer 116 is formed at a pressure between about 0 torr to about 100 torr. In some embodiments, the conformal dielectric layer 116 is formed using an organosilicate. In some embodiments, the conformal dielectric layer 116 comprises a low dielectric constant material having dielectric constant of less than about 3. In some embodiments, the conformal dielectric layer 116 comprises nitride or oxide. Other materials for the conformal dielectric layer 116 and/or other techniques for forming the conformal dielectric layer 116 are within the scope of various embodiments.

According to some embodiments, a first area 128a exists between the first conductive line 112a and the second conductive line 112b, and a second area 128b exists between the second conductive line 112b and the third conductive line 112c. According to some embodiments, a shape of the first area 128a is the same as or different than a shape of the second area 128b. According to some embodiments, a first top width 133a of the first area is 128a is less than a first bottom width 134a of the first area 128a. According to some embodiments, the first top width 133a is defined between a first upper portion 116a and a second upper portion 116b of the conformal dielectric layer 116 over upper portions of the first conductive line 112a and the second conductive line 112b, respectively. According to some embodiments, the first bottom width 134a is defined between a first bottom portion 116c and a second bottom portion 116d of the conformal dielectric layer 116 formed over lower portions of the first conductive line 112a and the second conductive line 112b, respectively.

According to some embodiments, a second top width 133b of the second area 128b is less than a second bottom width 134b of the second area 128b. According to some embodiments, the second top width 133b is defined between a third upper portion 116e and a fourth upper portion 116f of the conformal dielectric layer 116 over upper portions of the second conductive line 112b and the third conductive line 112c, respectively. According to some embodiments, the second bottom width 134b is defined between a third bottom portion 116g and a fourth bottom portion 116h of the conformal dielectric layer 116 formed over lower portions of the second conductive line 112b and the third conductive line 112c, respectively. According to some embodiments, the first top width 133a is the same as or different than the second top width 133b. According to some embodiments, the first bottom width 134a is the same as or different than the second bottom width 134b.

Figure 6:
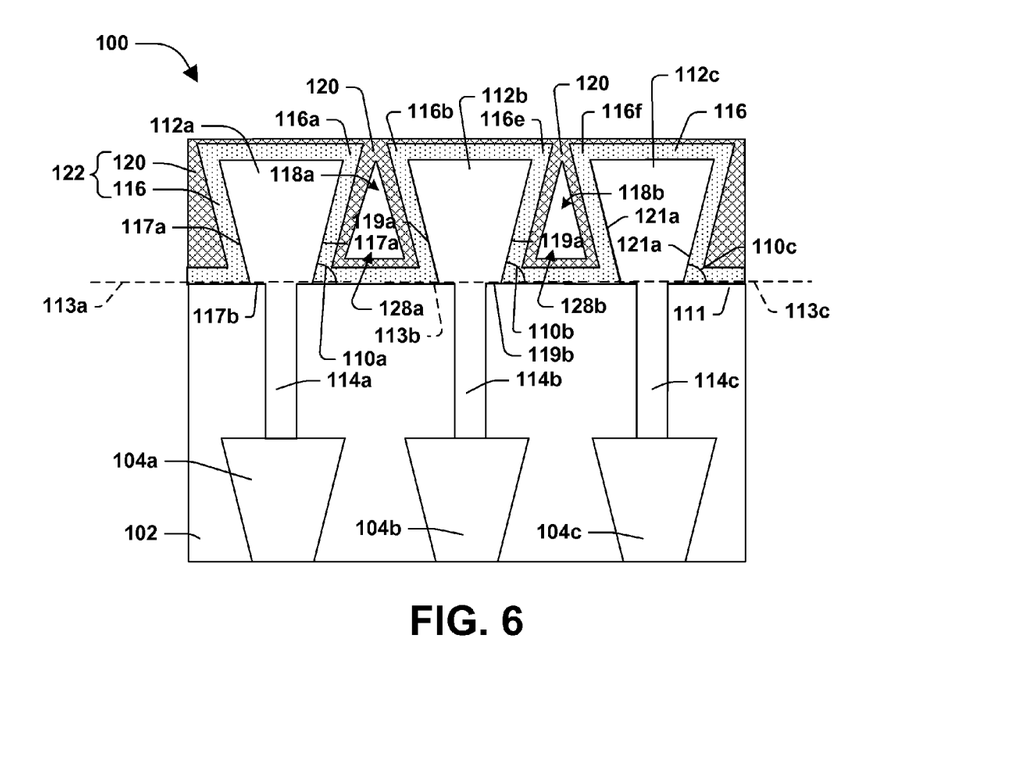
FIG. 6 is a cross-section diagram illustrating formation of a non-conformal dielectric layer for a semiconductor arrangement, in accordance with some embodiments.

Turning to FIG. 6, a non-conformal dielectric layer 120 is formed over the conformal dielectric layer 116 to form the first air gap 118a, according to some embodiments. As with the conformal dielectric layer 116, the non-conformal dielectric layer 120 is illustrated using a pattern so that the non-conformal dielectric layer 120 is more easily distinguishable from other features, layers, etc. According to some embodiments, the first dielectric layer 122 comprises two portions, where the conformal dielectric layer 116 comprises a first portion of the first dielectric layer 122 and the non-conformal dielectric layer 120 comprises a second portion of the first dielectric layer 122. According to some embodiments, the non-conformal dielectric layer 120 does not have a uniform thickness or has a thickness that varies over different potions of the conformal dielectric layer 116, and thus is regarded as non-conformal.

In some embodiments, the non-conformal dielectric layer 120 is formed by at least one of growth or deposition. Forming the non-conformal dielectric layer 120 by growth comprises forming a thin film using at least one of one or more gaseous precursors or one or more liquid precursors, according to some embodiments. Forming the non-conformal dielectric layer 120 by deposition comprises using at least one of ALD, CVD, PVD or a spin on technique according to some embodiments. In some embodiments, the non-conformal dielectric layer 120 is formed at a temperature between about 0° C. to about 500° C. In some embodiments, the non-conformal dielectric layer 120 is formed at a pressure between about 0 ton to about 100 torr. In some embodiments, the non-conformal dielectric layer 120 is formed using an organosilicate. In some embodiments, the non-conformal dielectric layer 120 comprises a low dielectric constant material having a dielectric constant of less than about 3. In some embodiments, the non-conformal dielectric layer 120 comprises nitride or oxide. Other materials for the non-conformal dielectric layer 120 and/or other techniques for forming the non-conformal dielectric layer 120 are within the scope of various embodiments.

Given that the first dielectric layer 122 comprises both the conformal dielectric layer 116 and the non-conformal dielectric layer 120, and given that the conformal dielectric layer 116 and the non-conformal dielectric layer 120 both have a relatively low dielectric constant, the first dielectric layer 122 has a relatively low dielectric constant, such as a dielectric constant of less than about 3. In some embodiments, the first dielectric layer 122 has a dielectric constant of about 2.5.

Due to the relatively small size of the first top width 133a, such as compared to the first bottom width 134a, the non-conformal dielectric layer 120 pinches off before completely filling the first area 128a, according to some embodiments. For example, a space between the first upper portion 116a and the second upper portion 116b of the conformal dielectric layer 116 is filled by the non-conformal dielectric layer 120 before the remainder of first area 128a is filled by the non-conformal dielectric layer 120, according to some embodiments. According to some embodiments, some of the non-conformal dielectric layer 120 does, however, form on the conformal dielectric layer 116 over angled sidewalls 117a and 119a and over the top surface 111 of the second dielectric layer 102 before the pinch off occurs. In some embodiments, the first air gap 118a is thereby defined within the first dielectric layer 122, where the first air gap 118a has a dielectric constant of about 1. According to some embodiments, a shape of the first air gap 118a is similar to a shape of the first area 128a, such as trapezoidal or triangular, although other shapes are within the scope of various embodiments.

According to some embodiments, a second air gap 118b, having a dielectric constant of about 1, is formed between the second conductive line 112b and the third conductive line 112c. In some embodiments, the second air gap 118b is formed in a similar manner as the first air gap 118a, where a space between the third upper portion 116e and the fourth upper portion 116f pinches off or is filled by the non-conformal dielectric layer 120 before the remainder of second area 128b is filled by the non-conformal dielectric layer 120. According to some embodiments, a shape of the first air gap 118a is the same as or different than a shape of the second air gap 118b, such as trapezoidal, triangular, elliptical, oval, teardrop, etc. According to some embodiments, one or more dimensions of the first air gap 118*a* are the same as or different than one or more corresponding dimensions of the second air gap 118*b*. Formation of additional air gaps between additional conductive lines is within the scope of various embodiments.

The semiconductor arrangement 100 has improved performance as compared to a semiconductor arrangement that does not have such air gaps between conductive lines, and as compared to a semiconductor arrangement that has a dielectric layer that is etched to form conductive lines. According to some embodiments, the improved performance results from reduced capacitive coupling, where the reduced capacitive coupling results from the lower dielectric constant of the air gap as compared to that of the first dielectric layer 122 and from the more uniform lattice structure of the first dielectric layer 122, since the first dielectric layer 122 is not etched. Moreover, given that the air gaps are established as part of forming the first dielectric layer 122, no subsequent etching of the first dielectric layer 122 is used to form such air gaps. Accordingly, the first dielectric layer 122 and the conductive lines remain substantially undamaged because they are not subjected to any such subsequent etching. Having the first dielectric layer 122 and the conductive lines remain substantially undamaged mitigates degradation of performance of the semiconductor arrangement 100.

According to some embodiments, a method of forming a semiconductor arrangement comprises forming a first conductive line having sidewalls that are at a first angle of between about 45° to about 90° relative to a first plane in which a bottom surface of the first conductive line lies. The method also comprises forming a first dielectric layer over the first conductive line such that a first air gap is defined within the first dielectric layer, where the first air gap is adjacent the first conductive line.

According to some embodiments, a semiconductor arrangement comprises a first conductive line having sidewalls at a first angle between about 45° to about 90° relative to a first plane in which a bottom surface of the first conductive line lies. The semiconductor arrangement comprises a first dielectric layer surrounding the first conductive line, a first air gap is defined within the first dielectric layer, where the first air gap is adjacent the first conductive line.

According to some embodiments, a method of forming a semiconductor arrangement comprises forming a first conductive line having sidewalls that are at a first angle of between about 45° to about 90° relative to a first plane in which a bottom surface of the first conductive line lies and forming a second conductive line having sidewalls that are at a second angle of between about 45° to about 90° relative to a second plane in which a bottom surface of the second conductive line lies. The method also comprises forming a first dielectric layer over the first conductive line and the second conductive line such that a first air gap is defined within the first dielectric layer between the first conductive line and the second conductive line.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as etching techniques, planarization techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement comprising:
   forming a first dielectric layer;
   forming a skeleton layer over the first dielectric layer;
   etching through the skeleton layer to define a first trench and etching through a portion of the first dielectric layer exposed through the first trench to define a first via opening;
   forming a first conductive line within the first trench and a first via within the first via opening, the first conductive line having a sidewall that is at a first angle of at least 45° and less than 90° relative to a first plane in which a bottom surface of the first conductive line lies; and
   replacing the skeleton layer, comprising:
      removing the skeleton layer to expose the sidewall of the first conductive line;
      forming a second dielectric layer on the exposed sidewall and surrounding the first conductive line, the second dielectric layer extending over a top surface of the first conductive line from a first edge of the top surface of the first conductive line to a second edge of the top surface of the first conductive line; and
      forming a third dielectric layer over the second dielectric layer, a first air gap defined within the third dielectric layer, where the first air gap is adjacent the first conductive line.

2. The method of claim 1, the forming the first conductive line comprising filling the first trench with conductive material, the first trench defined by a sidewall in the skeleton layer having the first angle.

3. The method of claim 2, comprising:
   etching through the skeleton layer to define a second trench, where the second trench is defined by a second sidewall in the skeleton layer having a second angle of at least 45° and less than 90°; and
   forming a second conductive line within the second trench.

4. The method of claim 1, the removing the skeleton layer comprising at least one of:
   performing a wet etch comprising using at least one of glycolether compound, modified oxirane polymer, organosulfur compound, methylimidazole, aminoethanol, aminopropanol, hydroxyamine, tetramethylammonium hydroxide, hydrogen peroxide, dilute hydrogen fluoride, or hydrogen fluoride, or
   performing a dry etch comprising using at least one of carbon dioxide, oxygen, or a nitrogen hydrogen strip.

5. The method of claim 1, the removing the skeleton layer comprising performing at least one of a wet etch or a dry etch.

6. The method of claim 1, the first via opening exposing a first conductive contact in the first dielectric layer.

7. The method of claim 1, comprising forming the first via in the first via opening prior to the forming the first conductive line.

8. A semiconductor arrangement comprising:
   a first conductive line having a sidewall at a first angle of at least 45° and less than 90° relative to a first plane in which a bottom surface of the first conductive line lies;
   a first dielectric layer surrounding the first conductive line; and
   a second dielectric layer below the first conductive line, wherein:
      the first dielectric layer comprises:
         a third dielectric layer surrounding the first conductive line, the third dielectric layer in direct contact with the second dielectric layer and a sidewall of the first conductive line, the third dielectric layer extending along a top surface of the second dielectric layer between the first conductive line and a second conductive line; and
         a fourth dielectric layer over the third dielectric layer, a first air gap defined within the fourth dielectric layer, where the first air gap is adjacent the first conductive line.

9. The semiconductor arrangement of claim 8, the third dielectric layer and the fourth dielectric layer comprising low dielectric constant materials.

10. The semiconductor arrangement of claim 8, the first conductive line in contact with a first via in the second dielectric layer.

11. The semiconductor arrangement of claim 10, the first via comprising at least one of copper, cobalt, tungsten, titanium or tantalum.

12. The semiconductor arrangement of claim 8, the first conductive line comprising at least one of copper, cobalt, tungsten, titanium or tantalum.

13. A method of forming a semiconductor arrangement comprising:
   forming a first dielectric layer;
   forming a skeleton layer over the first dielectric layer;
   etching through the skeleton layer to define a first trench and a second trench;
   forming a first conductive line within the first trench, the first conductive line having a sidewall that is at a first angle of at least 45° and less than 90° relative to a first plane in which a bottom surface of the first conductive line lies;
   forming a second conductive line within the second trench, the second conductive line having a sidewall that is at a second angle of at least 45° to less than 90° relative to a second plane in which a bottom surface of the second conductive line lies;
   removing the skeleton layer to expose the sidewall of the first conductive line and the sidewall of the second conductive line; and
   forming a second dielectric layer over the first conductive line and the second conductive line, comprising:
      forming a third dielectric layer on the exposed sidewall of the first conductive line and the exposed sidewall of the second conductive line, the third dielectric layer surrounding the first conductive line and the second conductive line and in direct contact with the exposed sidewall of the first conductive line and the exposed sidewall of the second conductive line, the third dielectric layer extending along a top surface of the first dielectric layer between the first conductive line and the second conductive line; and
      forming a fourth dielectric layer over the third dielectric layer, a first air gap defined within the fourth dielectric layer between the first conductive line and the second conductive line.

14. The method of claim 13, at least one of:
   the forming the first conductive line comprising filling the first trench with conductive material, the first trench defined by a sidewall in the skeleton layer having the first angle; or
   the forming the second conductive line comprising filling the second trench with conductive material, the second trench defined by a sidewall in the skeleton layer having the second angle.

15. The method of claim 13, the removing the skeleton layer comprising at least one of:
   performing a wet etch comprising using at least one of glycolether compound, modified oxirane polymer, organosulfur compound, methylimidazole, aminoethanol, aminopropanol, hydroxyamine, tetramethylammonium hydroxide, hydrogen peroxide, dilute hydrogen fluoride, or hydrogen fluoride, or
   performing a dry etch comprising using an etchant comprising at least one of carbon dioxide, oxygen, or a nitrogen hydrogen strip.

16. The method of claim 13, the removing the skeleton layer comprising performing at least one of a wet etch or a dry etch.

17. The method of claim 13, wherein the fourth dielectric layer is formed in direct contact with the third dielectric layer.

18. The method of claim 13, comprising at least one of:
   forming a first via opening in the first dielectric layer, the first via opening formed under the first trench, the first via opening exposing a first conductive contact in the first dielectric layer; or
   forming a second via opening in the first dielectric layer, the second via opening formed under the second trench, the second via opening exposing a second conductive contact in the first dielectric layer.

19. The method of claim 18, comprising at least one of:
   forming a first via in the first via opening prior to the forming the first conductive line; or
   forming a second via in the second via opening prior to the forming the second conductive line.

20. The method of claim 13, wherein the third dielectric layer is formed in direct contact with the first dielectric layer.

* * * * *